(12) United States Patent
Chang

(10) Patent No.: US 8,105,951 B2
(45) Date of Patent: Jan. 31, 2012

(54) METHOD FOR FABRICATING DEVICE PATTERN

(75) Inventor: Yu-Yao Chang, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 607 days.

(21) Appl. No.: 12/269,040

(22) Filed: Nov. 12, 2008

(65) Prior Publication Data

US 2010/0062604 A1    Mar. 11, 2010

(30) Foreign Application Priority Data

Sep. 5, 2008 (TW) .............................. 97134228 A

(51) Int. Cl.
*H01L 21/311* (2006.01)
(52) U.S. Cl. ......... 438/696; 438/151; 438/618; 438/720
(58) Field of Classification Search .................. 438/696, 438/151, 618, 720; 257/E21.249
See application file for complete search history.

(56) References Cited

U.S. PATENT DOCUMENTS

2008/0230852 A1* 9/2008 Yu et al. ........................ 257/401

* cited by examiner

*Primary Examiner* — Nadine G Norton
*Assistant Examiner* — Mahmoud Dahimene
(74) *Attorney, Agent, or Firm* — Jianq Chyun IP Office

(57) ABSTRACT

A method for fabricating a device pattern includes the following steps. A first pattern having a first density is formed in a pre-determined region on a substrate. The first pattern includes a base portion along a first direction and at least two protruding portions along a second direction and connected to the base portion. A spacer is formed on a sidewall of each protruding portion. The spacers do not connect with the base portion, and the spacers between two adjacent protruding portions do not connect with each other, so as to form a gap between the two adjacent protruding portions. Then, a second pattern is formed on the substrate and located in the gap, such that a third pattern having a second density is formed in the pre-determined region by the first pattern and the second pattern.

6 Claims, 3 Drawing Sheets

METHOD FOR FABRICATING DEVICE PATTERN

CROSS-REFERENCE TO RELATED APPLICATION

This application claims the priority benefit of Taiwan application serial no. 97134228, filed on Sep. 5, 2008. The entirety of the above-mentioned patent application is hereby incorporated by reference herein and made a part of this specification.

BACKGROUND OF THE INVENTION

1. Field of the Invention

The present invention generally relates to a method for fabricating a semiconductor device, in particular, to a method for fabricating a device pattern.

2. Description of Related Art

As the integration of semiconductor devices has been increasingly enhanced, the size of a circuit device is generally reduced according to a design rule about reducing the volume in the process for fabricating an integrated circuit (IC) device. However, although the line width and line pitch of the wire are continuously reduced, they are still restricted to a certain extent. For example, a lithography process has an exposure limit, so that an insufficient resolution is resulted, and thus, the current line width and line pitch can merely be reduced to a certain level.

When a comb-shaped pattern is fabricated, it is still difficult to reduce the line pitch between two wires. In the prior art, a line by spacer fill (LBSF) method is provided to form a third wire between two wires, so as to effectively reduce the line pitch between the two wires. However, the LBSF method is not applicable to the fabrication of a comb-shaped pattern due to the following reason. When the LBSF method is adopted to fabricate a comb-shaped pattern, the third wire subsequently formed between the former two wires is unable to be connected to the comb-shaped pattern, such that a comb-shaped pattern with a line pitch smaller than the exposure limit cannot be formed.

SUMMARY OF THE INVENTION

Accordingly, the present invention is directed to a method for fabricating a device pattern, so as to form a pattern with a line pitch smaller than an exposure limit.

As embodied and broadly described herein, a method for fabricating a device pattern is provided in the present invention, which includes the following steps. A first pattern having a first density is formed on a substrate. The first pattern includes a base portion along a first direction and at least two protruding portions along a second direction and each protruding portion connected to the base portion respectively. The first direction further intersects with the second direction. A spacer is formed on a sidewall of each protruding portion. The spacers on the sidewall of each protruding portion do not contact the base portion, and the spacers between two adjacent protruding portions do not contact each other such that a gap is defined between the two adjacent protruding portions. Then, a second pattern is formed on the substrate and located in the gap, which fills the gap, such that a third pattern having a second density is formed by the first pattern and the second pattern.

According to an embodiment of the present invention, in the method for fabricating a device pattern, a step for forming the spacers includes the following steps. First, a spacer layer is formed along a sidewall of the first pattern. Then, a first mask layer is formed on the substrate to partially remove the spacer layer to prevent the spacers from contacting with the base portion, such that the gap is defined.

According to an embodiment of the present invention, in the method for fabricating a device pattern, a step for forming the second pattern includes the following steps. First, a filler layer is formed on the substrate, so as to fill the gap and cover the first pattern and the spacers. Then, the filler layer is partially removed to expose the first pattern and the spacers.

According to an embodiment of the present invention, in the method for fabricating a device pattern, the step for forming the second pattern further includes the following steps. First, a second mask layer is formed on the substrate, so as to cover the filler layer and the first pattern. Then, the filler layer is partially removed through the second mask layer.

According to an embodiment of the present invention, in the method for fabricating a device pattern, the second density is larger than the first density.

According to an embodiment of the present invention, in the method for fabricating a device pattern, a material of the first pattern has the same material characteristics as that of the second pattern.

As described above, in the method for fabricating a device pattern provided by the present invention, the spacer formed on a sidewall of each protruding portion of the first pattern does not contact the base portion, and the spacers do not contact each other either. Therefore, the second pattern subsequently formed in the gap is connected to the base portion, so as to obtain a third pattern with a line pitch smaller than an exposure resolution.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
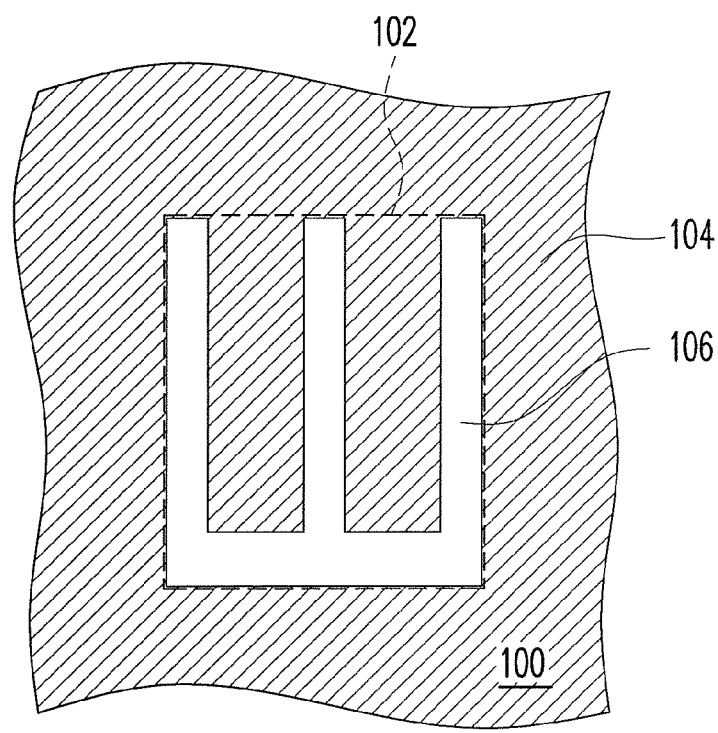
FIGS. 1A to 1E are top views of a process for fabricating a device pattern according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIGS. 1A to 1E are top views of a process for fabricating a device pattern according to an embodiment of the present invention.

First, referring to FIG. 1A, a substrate 100 is provided, which has a pre-determined region 102 for forming of a device pattern in the following process. The substrate 100 is, for example, a silicon substrate.

Next, a pattern material layer 104 is formed on the substrate 100. The pattern material layer 104 is made of, for example, a conductor, semiconductor, or insulator through a chemical vapor deposition (CVD) or physical vapor deposition (PVD). In this embodiment, the pattern material layer 104 is made of, for example but not limited to, doped poly-silicon.

Then, a mask layer 106 is formed on the pattern material layer 104 in the pre-determined region 102. The mask layer 106 is made of, for example, photoresist material, and is formed by, for example, a lithography process.

Figure 1B:
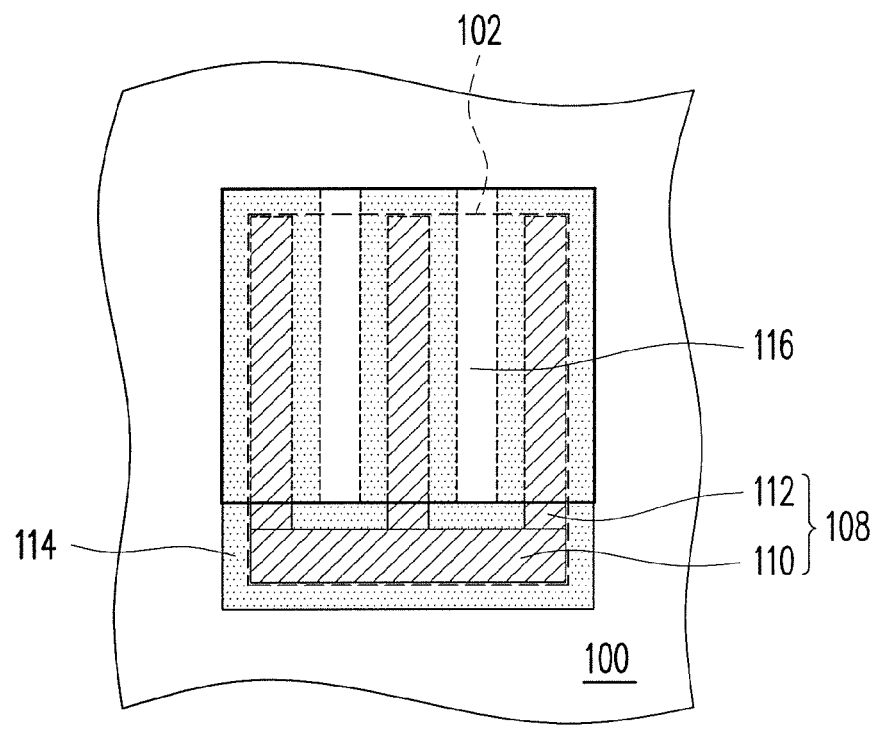

Referring to FIG. 1B, the pattern material layer 104 is partially removed through the mask layer 106, so as to form a first pattern 108 having a first density in the pre-determined region 102 on the substrate 100. The first pattern 108 includes a base portion 110 and protruding portions 112 connected to one side of the base portion 110. The base portion 110 extends along a first direction, the protruding portions 112 extend along a second direction, and the first direction intersects with the second direction. The pattern material layer 104 is partially removed through, for example, dry etching. In this embodiment, for example, three protruding portions 112 are shown. However, since the first pattern 108 can be formed by merely two protruding portions 112 and the base portion 110, the number of the protruding portions 112 is only required to be equal to or more than two. In this embodiment, the first pattern 108 is formed by, for example, the above processes, but the present invention is not so limited.

Then, the mask layer 106 is removed through, for example, dry etching.

Then, a spacer layer 114 is formed along a profile of the first pattern 108 on a sidewall of the first pattern 108. The spacer layer 114 is made of, for example, silicon nitride, and formed through the following steps. First, a spacer layer (not shown) is formed on the substrate 100 through CVD and covers the first pattern 108. Then, the spacer layer is back-etched through dry etching.

Then, a mask layer 116 is formed on the substrate 100. The mask layer 116 partially covers the protruding portions 112 and the spacer layer 114 while exposing the base portion 110, a part of the protruding portions 112, and a part of the spacer layer 114 at the position where it is connected to the base portion 100. The mask layer 116 is made of, for example, photoresist, and is formed through, for example, a lithography process.

Figure 1C:
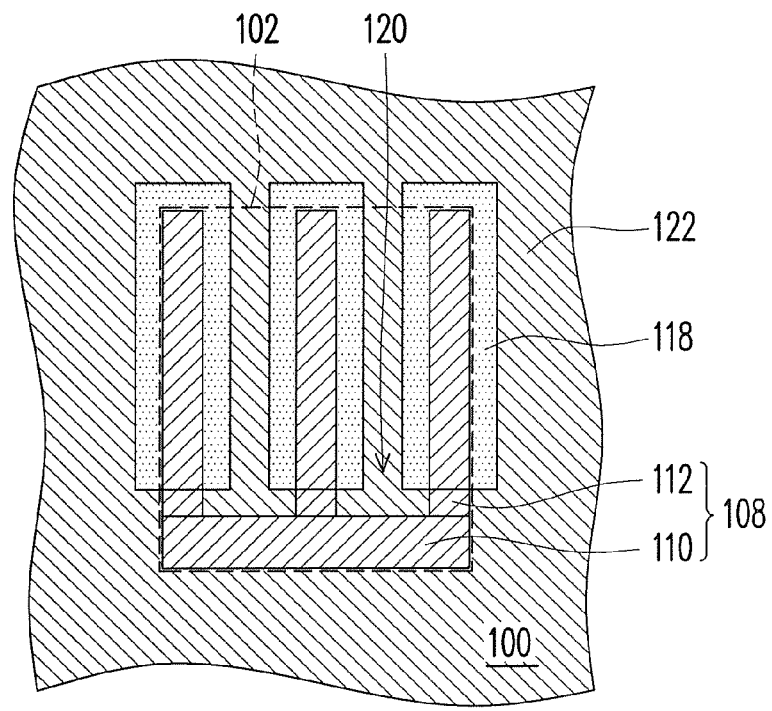

Next, referring to FIG. 1C, the spacer layer 114 is partially removed through the mask layer 116, so as to form a spacer 118 on a sidewall of each protruding portion 112. The spacers 118 and the base portion 110 do not contact with each other, and the spacers 118 between two adjacent protruding portions 112 do not contact with each other either, so as to form a gap 120 between the two adjacent protruding portions 112 and the base portion 110. The gap 120 is, for example, T-shaped. The spacer layer 114 is partially removed through, for example, dry etching. In this embodiment, the spacer 118 is formed through the above processes, but the present invention is not so limited.

Afterwards, the mask layer 116 is removed by means of, for example, dry etching.

Then, a filler layer 122 is formed on the substrate 100, which fills the gap 120 and exposes the first pattern 108 and the spacers 118. The filler layer 122 is made of, for example, a material having the same material characteristics as that of the first pattern 108, and is formed by the following processes. First, a filler material layer (not shown) is formed on the substrate 100, and covers the first pattern 108 and the spacers 118. Then, the filler material layer is partially removed through a chemical mechanical polishing (CMP) process, so as to expose the first pattern 108 and the spacers 118. The filler layer 122 is made of, for example, a conductor, semiconductor, or insulator through a CVD or PVD process. In this embodiment, the filler layer 122 is made of, for example, doped poly-silicon.

Figure 1D:
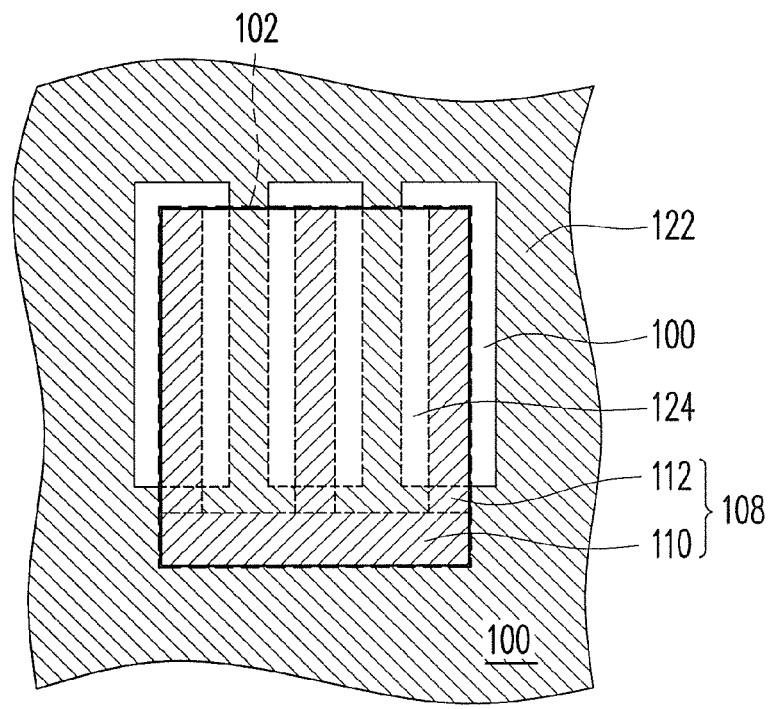

Next, referring to FIG. 1D, the spacers 118 are removed to expose the substrate 100. The spacers 118 are removed by means of, for example, dry etching or wet etching.

Then, a mask layer 124 is formed on the substrate 100, and covers the filler layer 122 located in the pre-determined region 102 and the first pattern 108. The mask layer 124 is made of, for example, photoresist, and formed through, for example, a lithography process.

Figure 1E:
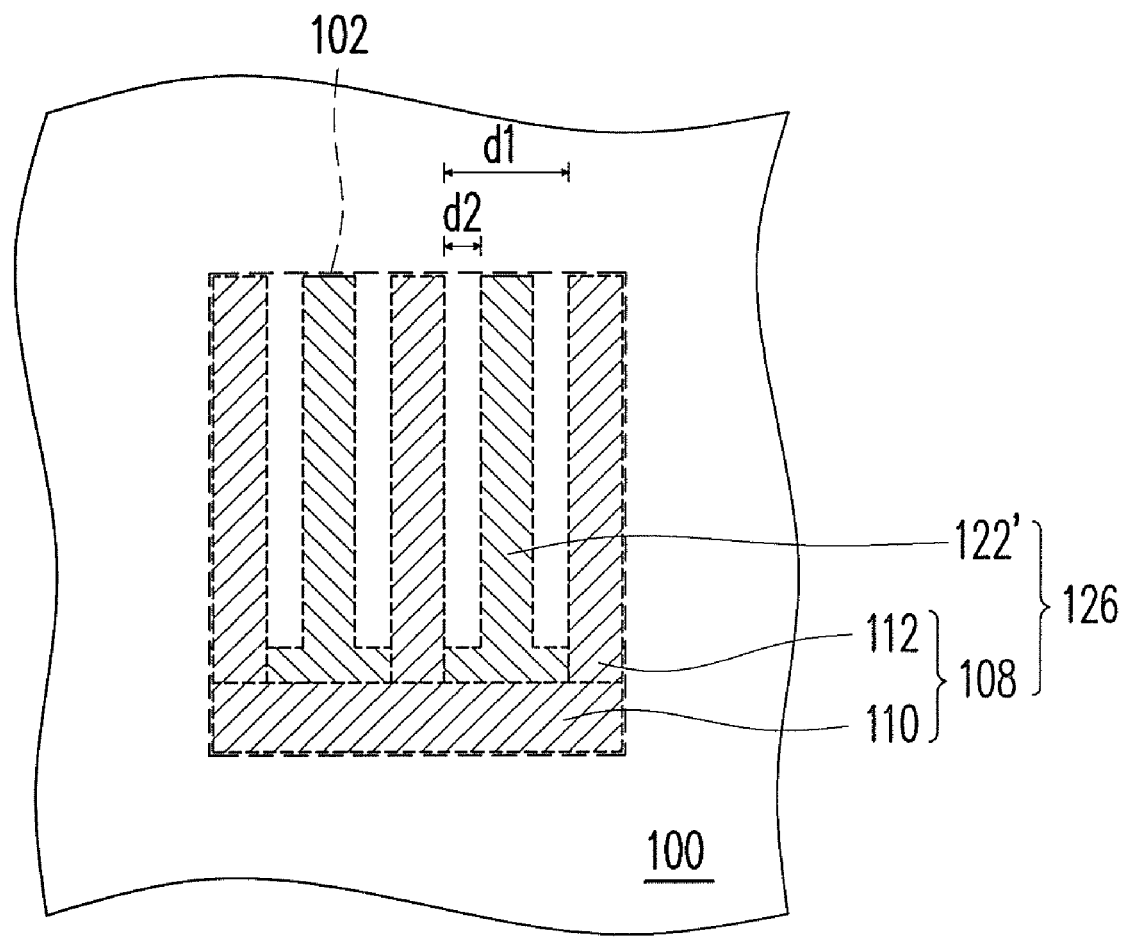

Furthermore, referring to FIG. 1E, the filler layer 122 outside the pre-determined region 102 is removed through the mask layer 124, so as to form a second pattern 122'. The second pattern 122' is located in the gap 120 and fills the gap 120, so as to define a third pattern 126 having a second density in the pre-determined region 102. The third pattern 126 is formed by the first pattern 108 and the second pattern 122' in the pre-determined region 102. The second pattern 122' in the pre-determined region 102 is connected to the base portion 110 of the first pattern 108, and serves as protruding portions. The filler layer 122 is partially removed by means of, for example, dry etching. As such, a line pitch d2 of the third pattern 126 is smaller than a line pitch d1 of the first pattern 108. Therefore, the density of the protruding portions in the third pattern 126 (i.e., the second density) is greater than that of the protruding portions in the first pattern 108 (i.e., the first density).

Finally, the mask layer 124 is removed by means of, for example, dry etching.

As known from the above embodiment, the spacer 118 formed on the sidewall of each protruding portion 112 does not contact with the base portion 110, and the spacers 118 between the two adjacent protruding portions 112 do not contact with each other either. Therefore, the filler layer 112 (i.e., the second pattern 122') formed in the gap 120 is connected to the base portion 110, such that the obtained third pattern 126 has the line pitch d2 smaller than the exposure resolution and has a great density of the protruding portions.

In view of the above, the embodiment of the present invention at least has the following advantages.

1. A pattern with a line pitch smaller than the exposure limit can be obtained by the method for fabricating a device pattern provided in the above embodiment.

2. The protruding portions of the pattern formed by the method provided in the above embodiment have a greater density.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a device pattern, comprising:
    forming a first pattern with a first density on a substrate, wherein the first pattern comprises a base portion along a first direction and at least two protruding portions along a second direction and each protruding portion connected to the base portion respectively, and the first direction intersects with the second direction, the first direction and the second direction are substantially parallel to a top surface of the substrate, and the base portion is positioned only at one end along the second direction of each protruding portion;
    forming a spacer on a sidewall of each protruding portion, wherein the spacers on the sidewall of each protruding portion do not contact the base portion, and the spacers between two adjacent protruding portions do not contact each other such that a gap is defined between the two adjacent protruding portions; and
    forming a second pattern on the substrate and located in the gap, such that a third pattern with a second density is formed by the first pattern and the second pattern.

2. The method for fabricating a device pattern according to claim 1, wherein the spacer forming step comprises:
   forming a spacer layer along a sidewall of the first pattern; and
   forming a first mask layer on the substrate to partially remove the spacer layer to prevent the spacers from contacting the base portion, such that the gap is defined.

3. The method for fabricating a device pattern according to claim 2, wherein the second pattern forming step comprises:
   forming a filler layer on the substrate to fill the gap and cover the first pattern and the spacers; and
   partially removing the filler layer to expose the first pattern and the spacers.

4. The method for fabricating a device pattern according to claim 3, wherein the second pattern forming step further comprises:
   forming a second mask layer on the substrate to cover the filler layer and the first pattern; and
   partially removing the filler layer through the second mask layer.

5. The method for fabricating a device pattern according to claim 1, wherein the second density is larger than the first density.

6. The method for fabricating a device pattern according to claim 4, wherein the first pattern has a material characteristic the same as that of the second pattern.

* * * * *